March 4, 1969 R. P. DOLAN, JR., ET AL 3,431,150

PROCESS FOR IMPLANTING GRIDS IN SEMICONDUCTOR DEVICES

Filed Oct. 7, 1966

INVENTORS
RUSSELL P. DOLAN Jr.,
BOBBY L. BUCHANAN,
SVEN A. ROOSILD
BY Harry A. Herbert Jr
ATTORNEY
Henry S. Miller Jr
AGENT 3,431,150
PROCESS FOR IMPLANTING GRIDS IN SEMICONDUCTOR DEVICES Russell P. Dolan, Jr., Concord, Bobby L. Buchanan, Carlisle, and Sven A. Roosild, Billerica, Mass., assignors to the United States of America as represented by the United States Air Force Filed Oct. 7, 1966, Ser. No. 586,001
U.S. Cl. 148—1.5 1 Claim
Int. Cl. H01l 7/54, 7/50, 7/48

ABSTRACT OF THE DISCLOSURE

A method of making field effect semiconductor devices with buried grids including the steps of bombarding a semiconductor substrate with monoenergetic ions after a gold mask has been etched through a photo resist located thereon.

The invention described herein may be manufactured and used by or for the United States Government for governmental purposes without payment to us of any royalty thereon.

This invention relates generally to a process used in the fabrication of semiconductor devices, and more particularly to a process of implanting high energy ions as a buried grid in semiconductor devices.

In the past, when a grid of vertical channels was to be formed in the drain region of a field effect transistor, it was sandwiched between the source and the drain in one of two alternative methods. First, by diffusing the low resistivity grid into the substrate before the epitaxial growth of the source; the second method involves selective growth of the grid regions using masked epitaxial techniques, and then continuing by growing the source region epitaxially.

In our new and novel process a buried grid of active impurities is ion implanted in the semiconductor material. Ion implantation is a process understood to be one in which junctions of p- and n-type material are fabricated in semiconductors by bombardment with a beam of energetic dopent ions.

With this process it is possible to fabricate devices at lower temperatures than hitherto thought possible. Likewise, this process provides a means for fabricating devices of extremely difficult geometry as well as providing a means for implanting semiconductors with atoms which do not easily diffuse.

It is therefore an object of this invention to provide a new method of fabricating semiconductor devices.

It is a further object of this invention to provide a new method for placing grids in semiconductor devices.

It is another object of this invention to provide a process for fabricating transistors with greater reproducibility than any hitherto known.

These and other advantages, features and objects of the invention will become more apparent from the following description taken in connection with the illustrative embodiments in the accompanying drawings, wherein.

Figure 1:
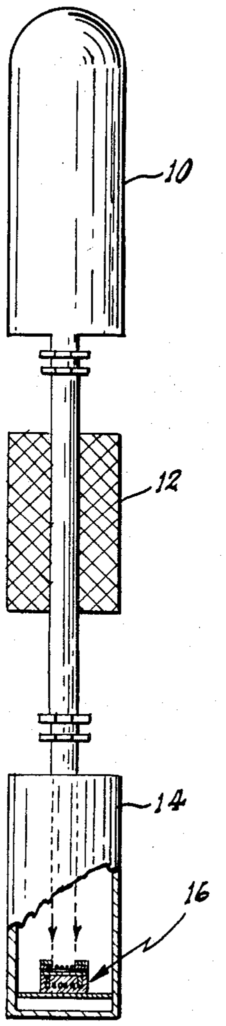
FIG. 1 is a side elevation view partly in section of the apparatus utilized by this invention.

Referring now to FIG. 1, an ion generator 10 of the Van de Graff or Cockroft-Walton type provides ions for this process. A mass spectrometer 12 separates the ions assuring that only monoenergetic ions of the selected species reach the evacuated chamber 14. The semiconductor material 16, covered with a selective ion absorbing mask, is mounted in the vacuum chamber and bombarded with ions which penetrate the unmasked portions of the material and form a buried grid.

Figure 2:
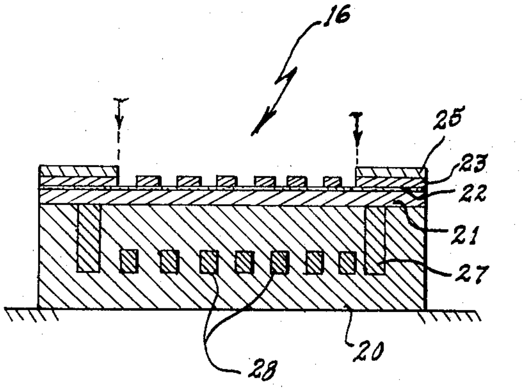
FIG. 2 is a cross sectional view of a semiconductor device produced by this invention.

Referring now to FIG. 2, where there is shown the semiconductor as it is after ion implantation, a quantity of substrate material 20 such as silicon or germanium has placed thereon a thin layer of oxide 21 which acts as a passivity material. A mask 23 is then placed over the material 21. The mask may be an ion absorbing oxide if the energy of the ions to be implanted does not exceed 400 kv. The thickness of the oxide required to absorb ions of higher energies would create an undesirable loss in resolution because of undercutting of the oxide which prevents narrowly spaced quantities of implanted material such as would be needed in a grid. Alternatively, and more desirably, a mask of gold, platinum or silver is utilized. Gold, for example, has an absorption factor of about 5 to 1 over most oxides. When a gold mask is used a thin layer of chromium 22 is flashed over the passive material 21 for better adhesion of the gold which is then evaporated or sputtered onto the chromium.

When the masking material 23 is in place a photo resist 25 of the appropriate grid design is placed on the gold with known photo techniques. The gold is then selectively etched through the photo resist, leaving the pattern of the grid to be implanted. The photo resist may be left or removed before the implantation with ions. The device is then bombarded with monoenergetic ions of the selected species of doping or impurity ions which are of the opposite conductivity as the host material, thereby forming a series of p-n junctions within the host material 20. The concentration of the ions desired will be determined by the energy of the ions utilized as well as the duration of bombardment.

Once the layer is implanted, the gold and chrome are removed with acid or other appropriate material. The device is subsequently heated in an oven to anneal radiation damage and to provide the activation energy necessary to place the majority of the implanted ions on lattice sites.

The grid is formed so that it attaches itself at the ends to a p-type material 27 in order that connections may be made to properly bias the grid 28.

The depth of the grid is controlled by the amount of energy given to the ions, for example, if phosphorus ions were being implanted into silicon, useful layers could be obtained with energies of 3 mev. and less.

Although the invention has been described with reference to a particular embodiment, it will be understood to those skilled in the art that the invention is capable of a variety of alternative embodiments within the spirit and scope of the appended claims.

We claim:

1. A method of making field effect semiconductor devices comprising the steps of: placing a layer of ion absorbing oxide on a body of semiconductor substrate material; flashing a layer of chromium on said layer of oxide; placing a layer of gold on the layer of chromium; placing a photo resist of a grid design on said gold; etching the grid design in the layer of gold; bombarding the composite with monoenergetic ions of a selected conductivity; and removing the mask, resist and ion absorbing oxide whereby the semiconductor material contains a buried layer of ions having a configuration congruent to the photo resist.

References Cited

UNITED STATES PATENTS 2,735,948 2/1956 Sziklai ............ 29—577 X
2,787,564 4/1957 Shockley.
3,138,744 6/1964 Kilby.

WILLIAM I. BROOKS, *Primary Examiner.*

U.S. Cl. X.R.

29—578, 584